United States Patent [19]
Taketomi et al.

[11] Patent Number: 5,994,979
[45] Date of Patent: Nov. 30, 1999

[54] MAGNETIC CORE NOISE FILTER WITH AN INTEGRALLY FORMED OUTER SHEATH AND INNER INSULATOR

[75] Inventors: Koji Taketomi; Kiyoshi Tanbo, both of Gunma-ken, Japan

[73] Assignee: Taiyo Yuden Kabushiki Kaisha, Tokyo, Japan

[21] Appl. No.: 09/017,056

[22] Filed: Jan. 27, 1998

[30] Foreign Application Priority Data

Feb. 4, 1997 [JP] Japan ................................. 9-021742

[51] Int. Cl.⁶ .............................. H01F 17/06; H03H 2/00
[52] U.S. Cl. ......................... 333/181; 333/12; 333/185; 336/176
[58] Field of Search ........................... 333/12, 181, 185; 336/175, 176

[56] References Cited

U.S. PATENT DOCUMENTS 4,970,476  11/1990  Kitagawa ................................. 333/12
4,983,932   1/1991  Kitagawa ................................. 333/12
5,764,125   6/1998  May ................................. 333/12 X

FOREIGN PATENT DOCUMENTS 63-39997  3/1988  Japan .
3-53807   5/1991  Japan .

*Primary Examiner*—Justin P. Bettendorf
*Attorney, Agent, or Firm*—Nikaido, Marmelstein, Murray & Oram, LLP

[57] ABSTRACT

A noise filter has a magnetic core having a pair of magnetic core members each with a coupling surface. Each of the magnetic core members has a dented portion so arranged that, when the magnetic core members are closed together on the coupling surfaces, a closed magnetic path and an opening for inserting therethrough a cable are formed between the magnetic core members. An electrically insulating outer sheath member is disposed on an outer surface of each of the pair of magnetic core members. An electrically insulating coating member is disposed on an inner wall surface of each of the dented portions.

5 Claims, 6 Drawing Sheets

5,994,979

MAGNETIC CORE NOISE FILTER WITH AN INTEGRALLY FORMED OUTER SHEATH AND INNER INSULATOR

BACKGROUND OF THE INVENTION

1. Field of the Invention

The present invention relates to a noise filter which is detachably mounted on (i.e., which is attached to, and detached from) a cable such as a data transfer line or the like.

2. Description of the Related Art

As a conventional noise filter which is detachably mounted on a cable such as a data transfer line or the like, there has hitherto been know one as disclosed in Japanese Published Unexamined Utility Model Registration Application No. 39997/1988. Namely, the noise filter comprises: a magnetic core which is made up of a pair of magnetic core members (or elements) of ferrite or the like such that, when the pair of magnetic core members are coupled (or closed) together on their coupling surfaces, a closed magnetic path is formed and an opening for inserting therethrough a cable is also formed between the magnetic core members; and an electrically insulating case which is made up of a pair of electrically insulating case members (or elements) for containing therein the pair of magnetic core members. When the pair of electrically insulating case members are closed together, the pair of magnetic core members are coupled together on their coupling surfaces.

As described above, in the conventional noise filter, the pair of magnetic core members are contained inside the respective electrically insulating case members, and the external surfaces of the magnetic cores are thus covered by the electrically insulating case. However, since the dented portions of the pair of magnetic core members which form the opening for inserting therethrough the cable are exposed to the outside, there is the following disadvantage. Namely, when the noise filter is attached to, or detached from, the cable, or when the noise filter is allowed to slide on the cable after it has been attached thereto, there is a possibility that the cladding of the cable (or a cable sheath) is damaged by the corner edges of the dented portions of the magnetic core members.

The present invention has an object of providing a noise filter which is free from the above-described disadvantage.

SUMMARY OF THE INVENTION

In order to attain the above and other objects, the present invention is a noise filter comprising: a magnetic core having a pair of magnetic core members each with a coupling surface, each of the pair of magnetic core members having a dented portion so arranged that, when the pair of magnetic core members are closed together on the coupling surfaces, a closed magnetic path and an opening for inserting therethrough a cable are formed therebetween; an electrically insulating outer sheath member which is disposed on an outer surface of each of the pair of magnetic core members; wherein an electrically insulating coating member is disposed on an inner wall surface of each of the dented portions.

Preferably, the electrically insulating outer sheath member and the electrically insulating coating member are made of a resin and are injection-molded to form an integral assembly with the magnetic core members. Each of the electrically insulating outer sheath members is made up of a case which covers an outer surface of the magnetic core member, and each of the electrically insulating coating members is a cover which covers the inner wall surface of each of the dented portions. Each of the electrically insulating coating members includes a projection formed on an inner wall surface thereof.

As described hereinabove, the pair of magnetic core members are covered by the electrically insulating outer sheath members which are provided on the outer surface of the magnetic core members, and are also covered by the electrically insulating coating members. Therefore, when the noise filter is attached to a cable through the opening for inserting therethrough the cable, the electric insulation can be secured and the safety can be enhanced. Further, since there is provided a projection on an inner surface of each of the electrically insulating coating members, the noise filter does not slide over or along the cable but is positively secured in a predetermined position.

BRIEF DESCRIPTION OF THE DRAWINGS

The above and other objects and the attendant advantages of the present invention will become readily apparent by reference to the following detailed description when considered in conjunction with the accompanying drawings wherein.

DETAILED DESCRIPTION OF PREFERRED EMBODIMENTS

An explanation will now be made about preferred embodiments of the present invention with reference to the drawings.

Figure 1:
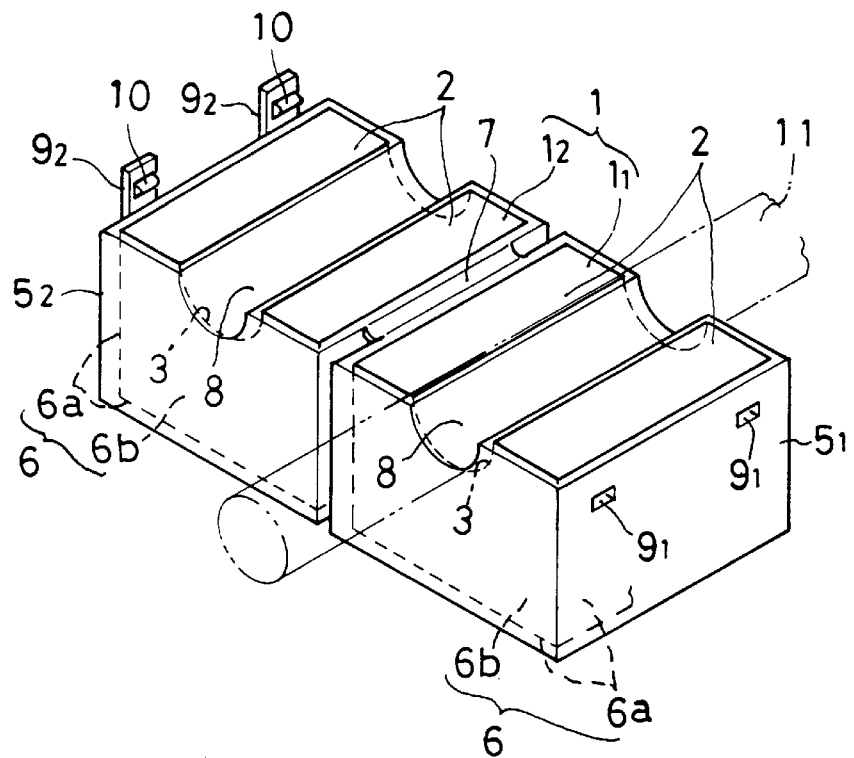
FIG. 1 is a perspective view of a noise filter of the present invention in a condition in which a pair of magnetic core members are opened.
Figure 2A:
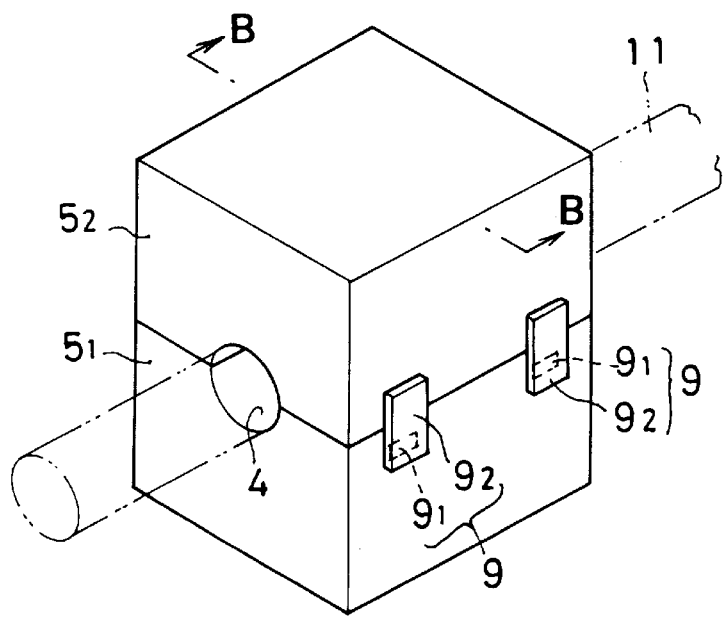
FIGS. 2A is a perspective view.
Figure 2B:
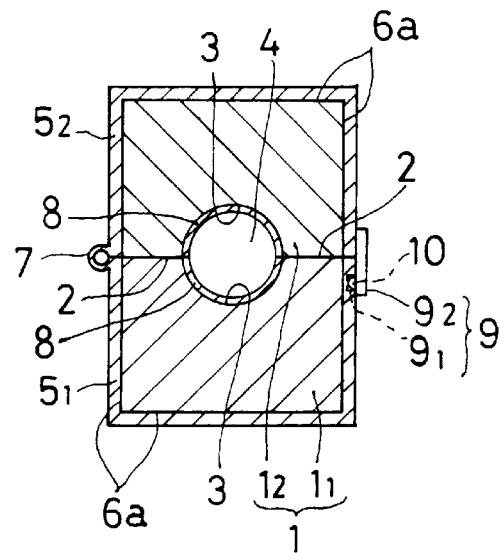
FIG. 2B is a sectional view, respectively, of the noise filter shown in FIG. 1 in a condition in which the pair of magnetic core members are coupled together.

FIG. 1 and FIGS. 2A, 2B show an example of a noise filter of the present invention.

In the figures, reference numeral 1 denotes a magnetic core in the shape of a rectangular parallelepiped which is made of a Ni—Zi ferrite, Mn—Zn ferrite or the like. This magnetic core 1 is made up of a magnetic core member $1_1$ and a magnetic core member $1_2$. As shown in FIG. 2B, it is so arranged that, when the magnetic core member $1_1$ and the magnetic core member $1_2$ are coupled (or closed) together on their coupling surfaces 2, 2, an opening 4 for inserting therethrough a cable is formed by dented portions 3 on the inner surfaces of the magnetic core members $1_1$, $1_2$. Numerals $5_1$, $5_2$ denote electrically insulating outer sheath members which are made, e.g., of a polypropylene resin. These sheath members $5_1$, $5_2$ are formed into an external shape of a rectangular parallelepiped such that the coupling surfaces 2 of the magnetic core members $1_1$, $1_2$ are exposed and that the external surfaces, i.e., the outer peripheral surface 6a and both side surfaces 6b, are covered by the electrically insulating outer sheath members $5_1$, $5_2$. The electrically insulating outer sheath members $5_1$, $5_2$ are connected together by means of a hinge portion 7. Reference numeral 8 denotes an electrically insulating coating member (or an internal cover element) which is made of a polypropylene resin and which covers an inner wall surface of each of the dented portions 3 of the magnetic core members $1_1$, $1_2$. The above-described electrically insulating outer sheath members $5_1$, $5_2$, the hinge portion 7, and the electrically insulating coating members 8 are formed integrally with the magnetic core member $1_1$ and the magnetic core member $1_2$ by a so-called injection molding method. In this method, the magnetic core members $1_1$, $1_2$ are disposed inside a metallic mold and the above-described resin that is heated to a molten state is injected into the metallic mold and is thereafter solidified. Therefore, the edge surfaces of the electrically insulating outer sheath members $5_1$, $5_2$, the edge surfaces of the electrically insulating coating member 8, and the coupling surfaces of the magnetic core member $1_1$ and the magnetic core member $1_2$ can be formed on a plane flush (or the same) with each other. As shown in FIG. 2B, when the magnetic core member $1_1$ and the magnetic core member $1_2$ are coupled together, the coupling surfaces of both members can be brought into close contact with each other. When the noise filter thus manufactured is attached to a cable, the magnetic core members $1_1$, $1_2$ do not come into direct contact with the cable, thereby resulting in an enhanced safety in electrical insulation. At the time of injection molding, the following are integrally formed respectively. Namely, a pair of holes $9_1$, $9_1$ for a joint (or a coupling) 9 are formed in that edge portion of the electrically insulating outer sheath member $5_1$ which is opposite to the hinge portion 7. Also, joint projection pieces $9_2$, $9_2$ with projections 10, 10 which are engaged with the pair of holes $9_1$, $9_1$ are formed in that edge portion of the electrically insulating outer sheath member $5_2$ which is also opposite to the hinge portion 7. It is thus so arranged that the magnetic core 1 can be easily attached to the cable 11 by engaging the projections 10, 10 of the joint projection pieces $9_2$, $9_2$ with the holes $9_1$, $9_1$. The above-described arrangement of the holes and the joint projection pieces may be the opposite. Namely, the pair of holes $9_1$, $9_1$ are formed in the electrically insulating outer sheath member $5_2$, and the joint projection pieces $9_2$, $9_2$ may be formed in the electrically insulating outer sheath member $5_1$. Further, in place of the above-described holes $9_1$, $9_1$, projections may be formed and, instead of the above-described projections 10 of the joint projection pieces $9_2$, $9_2$, holes to be engaged with the projections may be formed.

Figure 3:
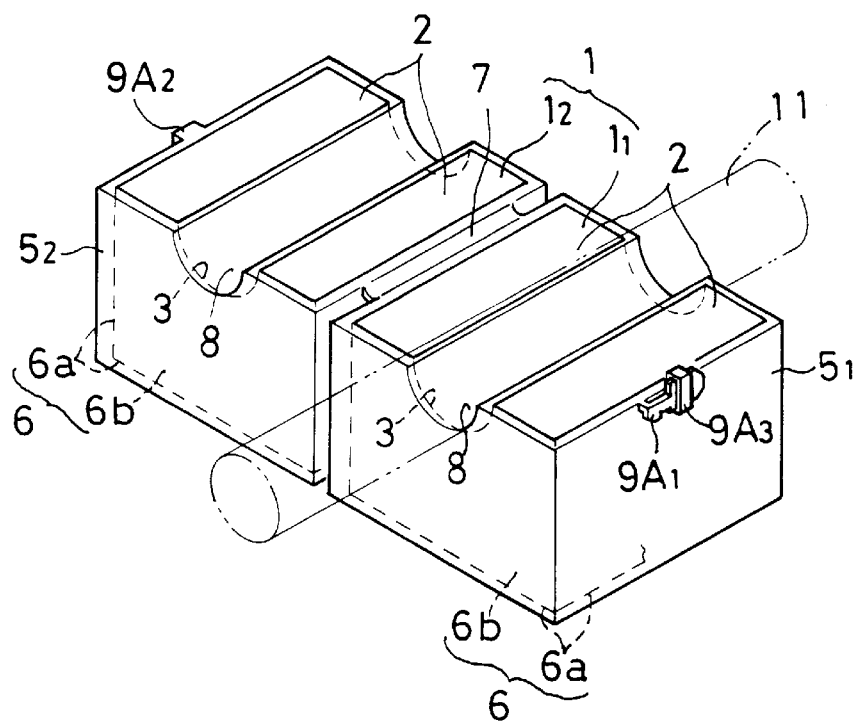
FIG. 3 is a perspective view of a modified noise filter of the present invention shown in FIG. 1, in which a different coupling is formed on electrically insulating outer sheath members $5_1$, $5_2$.

FIG. 3 shows a modified example of a noise filter of the present invention. In this example, a joint 9A (see FIGS. 4A–4C) which is different from the one in FIG. 1 is integrally formed in the electrically insulating outer sheath members $5_1$, $5_2$.

Figure 4A:
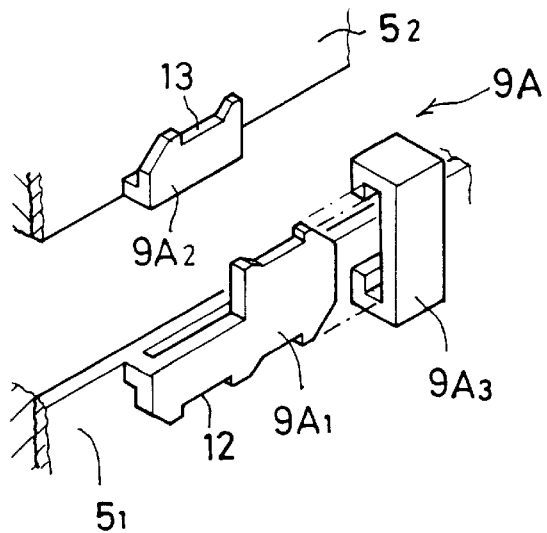
FIGS. 4A is an exploded perspective view of the coupling shown in FIG. 3.
Figure 4B:
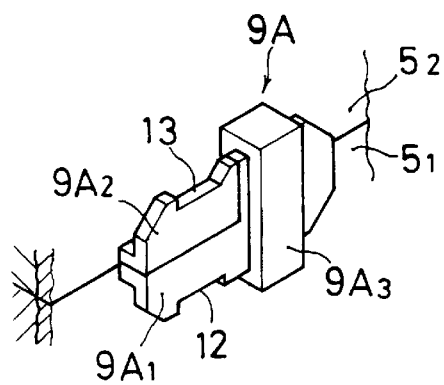
FIG. 4B is a perspective view of the coupling when the pair of magnetic core members are coupled together.
Figure 4C:
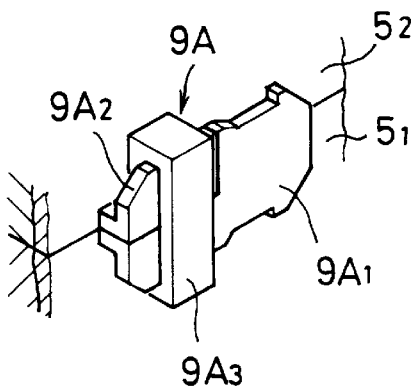
FIG. 4C is a perspective view of the coupling in a condition in which the pair of the magnetic core members are coupled together.

The joint 9A is made up, as shown in FIGS. 3 and 4A, of an coupling projection piece $9A_1$ which is formed in an edge portion of the electrically insulating outer sheath members $5_1$, a coupling projection piece $9A_2$ which is L-shaped in cross section and is formed in an edge portion of the electrically insulating outer sheath members $5_2$, and a C-shaped coupling stopper piece $9A_3$ which is slidably engaged with the coupling projection piece $9A_1$ having both ends formed in the shape of hooks. The magnetic core member $1_1$ and the magnetic core member $1_2$ are coupled together at the coupling surfaces 2, 2. In a condition in which the magnetic core 1 is attached to the cable 11, the coupling stopper $9A_3$ which is in a position as shown in FIG. 4B is moved, as shown in FIG. 4C, to a position of a dented portion 12 of the coupling projection piece $9A_1$ and a dented portion 13 of the coupling projection piece $9A_2$. The electrically insulating outer sheath members $5_1$, $5_2$ are thus firmly coupled together.

Figure 5:
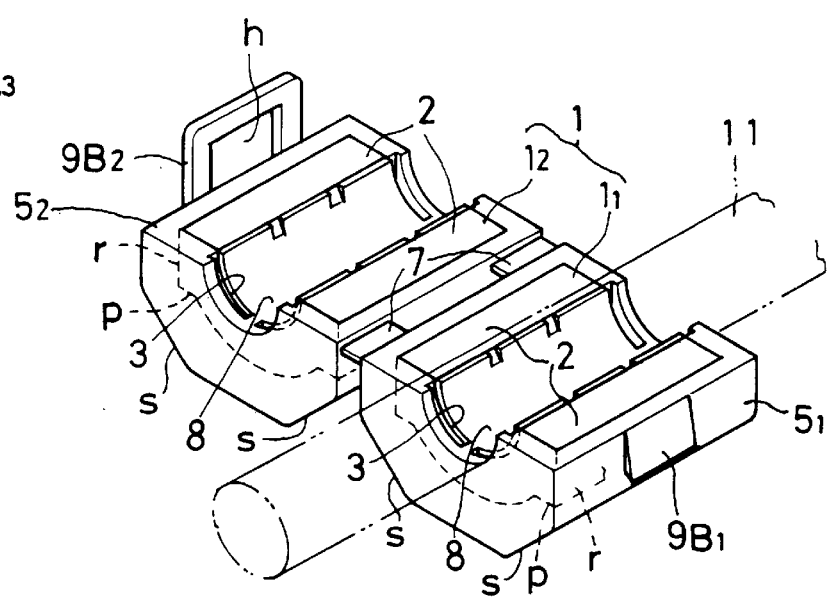
FIG. 5 is a perspective view of another example of the noise filter of the present invention in which the pair of magnetic core members are opened.
Figure 6A:
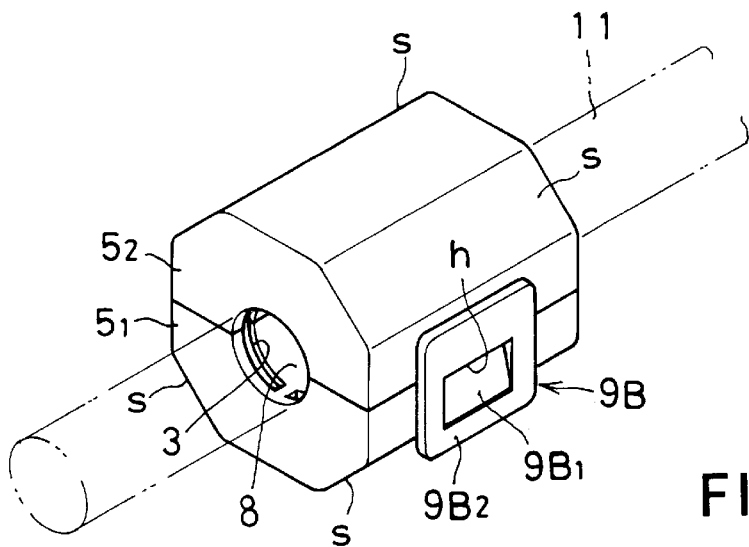
FIG. 6A is a perspective view of the noise filter shown in FIG. 5.
Figure 6B:
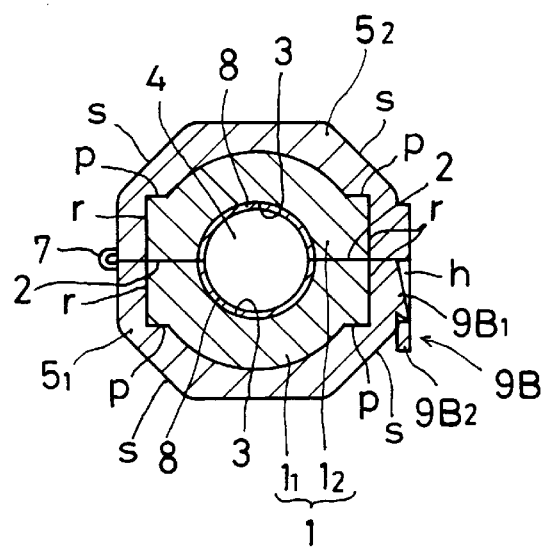
FIG. 6B is a sectional view thereof in a condition in which the pair of magnetic core members are coupled together.

FIGS. 5 and 6A, 6B show another embodiment of the noise filter of the present invention.

The magnetic core 1 of this noise filter is, like the one in the previous example, made up of a magnetic core member $1_1$ and a magnetic core member $1_2$ of Ni-Zi ferrite, Mn—Zn ferrite or the like. The magnetic core member $1_1$ and a magnetic core member $1_2$ are approximately semicylindrical. In order for the magnetic core member $1_1$ and the magnetic core member $1_2$ to be easily supported inside a metallic mold when the electrically insulating outer sheath members $5_1$, $5_2$ and an electrically insulating coating member 8 are formed into an assembly which is integral with the magnetic core member $1_1$ and the magnetic core member $1_2$ in an injection mold method, each of the magnetic core member $1_1$ and the magnetic core member $1_2$ is provided on an outer peripheral surface on both longitudinal ends thereof with projections having planes r, p which are respectively at right angles to, and parallel with, the coupling surfaces 2, 2. The electrically insulating outer sheath members $5_1$, $5_2$ have an outer shape which is formed into inclined surfaces s, s on both end portions. They are provided with a coupling 9B for keeping the magnetic core member $1_1$ and the magnetic core member $1_2$ in a coupled condition. At the time of injection molding, the following are integrally formed respectively. Namely, a joint projection piece $9B_1$ which is triangle in cross section is formed in that edge portion of the electrically insulating outer sheath member $5_1$ (or $5_2$) which is opposite to the hinge portion 7. Also, a joint projection piece $9B_2$ with a hole h for engaging with the coupling projection piece $9B_1$ is formed in that edge portion of the electrically insulating outer sheath member $5_2$ (or $5_1$) which is also opposite to the hinge portion 7. By deflecting the joint projection piece $9B_2$ so as to engage the coupling projection piece $9B_1$ with the hole h, the magnetic core 1 can be easily attached to the cable 11 with a single hand.

Figure 7:
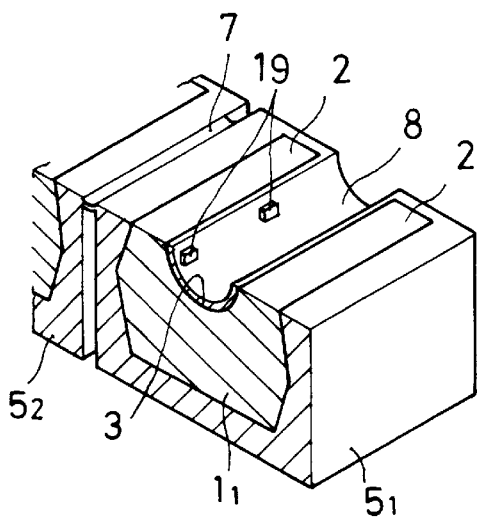
FIG. 7 is a sectional view of an important portion of the noise filter of the present invention in which the magnetic core members of external shape which are different from those in FIG. 1 are used, and in which an anti-sliding projection is disposed on an inner surface of an electrically insulating coating member.
Figure 8:
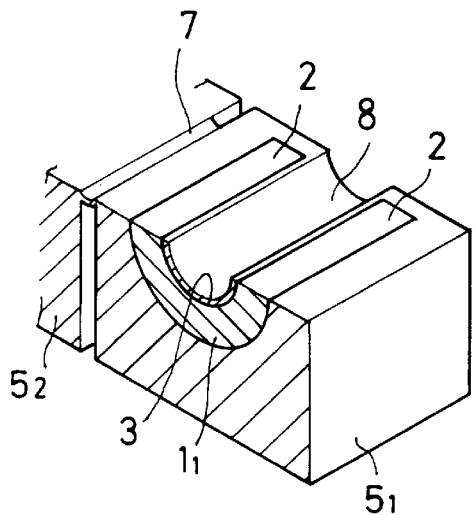
FIG. 8 is a sectional view of an important portion of the noise filter of the present invention in which the magnetic core members of external shape which are different from those in FIG. 1 are used.
Figure 9:
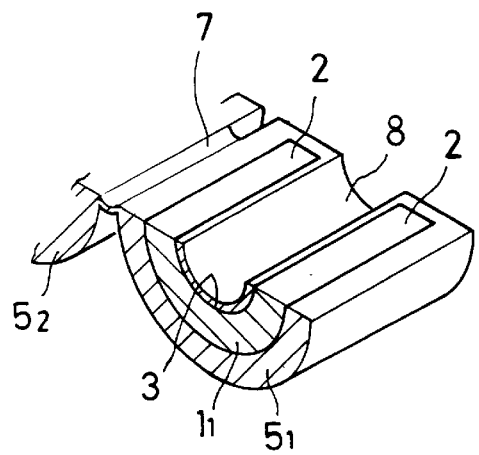
FIG. 9 is a sectional view of an important portion of the noise filter of the present invention in which the magnetic core members and electrically insulating outer sheath members of external shapes which are different from those in FIG. 1 are used.

The magnetic core members $1_1$, $1_2$ may be rectangular parallelepiped or approximately semicylindrical as described above. They may also be formed, as shown in FIG. 7, in a shape in which the opposite surfaces of the outer peripheries project outward. Or else, as shown in FIG. 8, the magnetic core member $1_1$, $1_2$ may be formed into a semicylindrical shape. Still furthermore, as shown in FIG. 9, the magnetic core members $1_1$, $1_2$ may be formed into a semicylindrical shape and the electrically insulating outer sheath members $5_1$, $5_2$ may similarly be formed into a semicylindrical shape. Aside from the above-described shapes, the outer surfaces of the magnetic core 1 and the electrically insulating outer sheath member $5_1$, $5_2$ may be formed into an appropriate shape.

Figure 10:
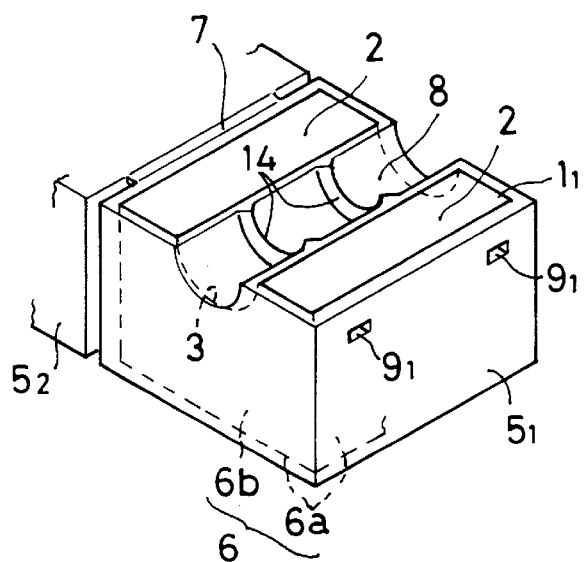
FIG. 10 is a perspective view of an important portion of a modified example of the electrically insulating coating member of the noise filter of the present invention.

FIG. 10 shows a modified embodiment of the noise filter of the present invention which is shown in FIG. 1. In this modified embodiment, there are provided projections which function to prevent the noise filter from longitudinally sliding when attached to the cable.

In a manner as described hereinabove, there is formed the following elements integrally with the electrically insulating outer sheath members $5_1$ which is formed on an outer surface of the magnetic core member $1_1$. Namely, two anti-sliding projections 14, 14 of triangular shape (or semicircular shape) in cross section are formed in an arcuate manner, e.g., as illustrated, on the inner surface of the electrically insulating coating member 8. The anti-sliding projection may be, as shown in FIG. 7, formed by one or a plurality of rectangular parallelepipeds or trapezoids 19.

In FIGS. 7, 8, 9 and 10, only the magnetic core member $1_1$ is illustrated. The magnetic core member $1_2$ also includes an electrically insulating outer sheath member $5_2$ and an electrically insulating coating member 8 which are formed in the same manner as with the magnetic core member $1_1$. The various couplings as the above-described ones 9, 9A or 9B are also employed therein.

Figure 11A:
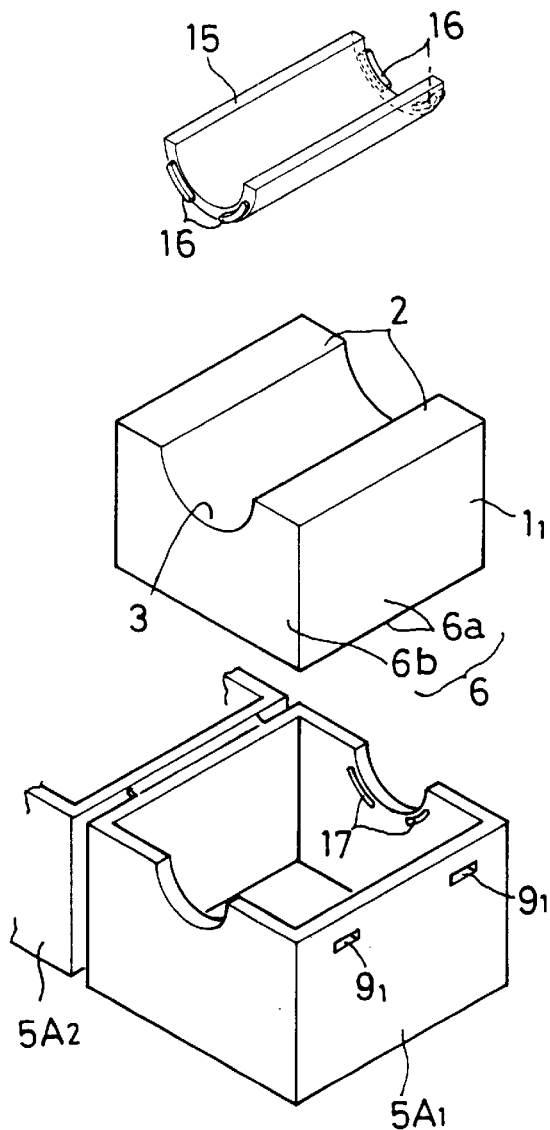
FIG. 11A is a perspective view.
Figure 11B:
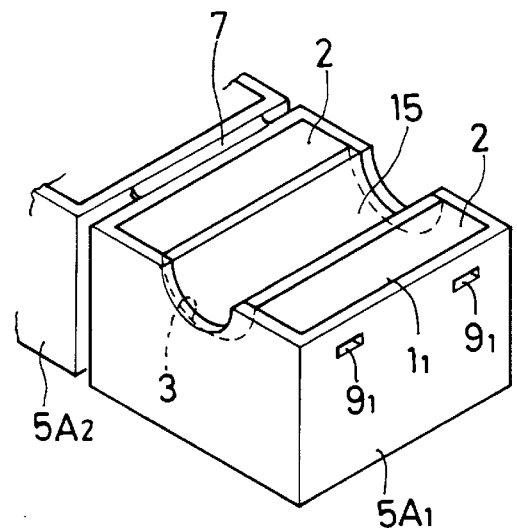
FIG. 11B is an exploded perspective view, respectively, of the noise filter of the present invention in which a case is used as the electrically insulating outer sheath member, and in which covers are used as an electrically insulating coating member.

FIGS. 11A and 11B show an example of a noise filter of the present invention in which a case is employed as the electrically insulating outer sheath member.

Figure 12:
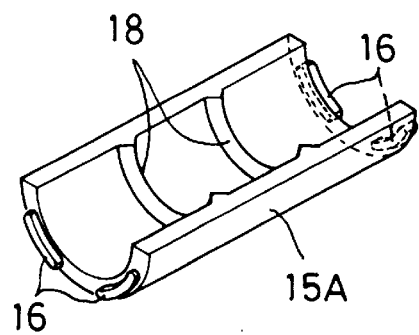
FIG. 12 is a perspective view of a modified embodiment of the cover shown in FIG. 11.

The magnetic core members $1_1$ and $1_2$ ($1_2$ is not illustrated) of the magnetic core 1 are the same as the one illustrated in FIG. 1. The electrically insulating outer sheath member is made up of cases $5A_1$, $5A_2$ ($5A_2$ is partly omitted) in which couplings $9_1$ ($9_2$ are not illustrated) are integrally formed. They are coupled together by means of a hinge 7 which is integrally formed with the cases $5A_1$, $5A_2$. On inner opposite walls of the cases $5A_1$, $5A_2$, there are respectively formed dented portions 17, 17 (or projections). Reference numeral 15 denotes a semicylindrical cover which is made of a resin and is formed as an electrically insulating coating member. Namely, the semicylindrical cover 15 functions to cover the inner surface of each of the dented portions 3, 3 of the magnetic core members $1_1$, $1_2$ such that the end surfaces thereof become flush with the coupling surfaces 2, 2 of the magnetic core members $1_1$, $1_2$ when placed in position inside the dented portion 3. On both end surfaces thereof, there are formed projections 16, 16 (or dented portions). As shown in FIG. 11B, the magnetic core members $1_1$, $1_2$ are contained inside the respective cases $5A_1$, $5A_2$. By fitting the above-described projections 16, 16 (or dented portions) of the covers 15, 15 into the dented portions 17, 17 (or projected portions) which are formed in the opposite inner walls of the cases $5A_1$, $5A_2$, the covers 15, 15 are assembled into the cases $5A_1$, $5A_2$. Instead of the above-described covers 15, 15, there may be used a cover 15A, as shown in FIG. 12, in which the anti-slipping projections 18, 18 are formed into a rectangular shape (or a semicircular shape) in cross section so as to extend across a central portion of the opening for inserting therethrough a cable.

It is readily apparent that the above-described noise filter meets all of the objects mentioned above and also has the advantage of wide commercial utility. It should be understood that the specific form of the invention hereinabove described is intended to be representative only, as certain modifications within the scope of these teachings will be apparent to those skilled in the art.

Accordingly, reference should be made to the following claims in determining the full scope of the invention.

What is claimed is:

1. A noise filter comprising:

a magnetic core having a pair of magnetic core members each with a coupling surface, each of said pair of magnetic core members having a dented portion so arranged that, when said pair of magnetic core members are closed together on said coupling surfaces, a closed magnetic path and an opening for inserting therethrough a cable are formed therebetween;

an electrically insulating outer sheath member which is disposed on an outer surface of each of said pair of magnetic core members;

wherein an electrically insulating coating member is disposed on an inner wall surface of each of said dented portions, wherein said electrically insulating outer sheath member and said electrically insulating coating member are made of a resin and are injection-molded to form an integral assembly with said magnetic core members, and wherein when said pair of magnetic core members are closed together on said coupling surfaces, said pair of magnetic core members contact each other at said coupling surfaces.

2. A noise filter according to claim 1, wherein each of said electrically insulating coating members includes a projection formed on an inner wall surface thereof.

3. A noise filter comprising:

a magnetic core having a pair of magnetic core members each with a coupling surface, each of said pair of magnetic core members having a dented portion so arranged that, when said pair of magnetic core members are closed together on said coupling surfaces, a closed magnetic path and an opening for inserting therethrough a cable are formed therebetween;

an electrically insulating outer sheath member which is disposed on an outer surface of each of said pair of magnetic core members;

wherein an electrically insulating coating member is disposed on an inner wall surface of each of said dented portions, wherein each of said electrically insulating outer sheath members is made up of a case which covers an outer surface of said magnetic member, wherein each of said electrically insulating coating members is a cover which covers said inner wall surface of each of said dented portions, wherein when said pair of magnetic core members are closed together on said coupling surfaces, said pair of magnetic core members contact each other at said coupling surfaces, and wherein each electrically insulating outer sheath member is directly connected to a corresponding electrically insulating inner sheath member.

4. A noise filter according to claim 3, wherein each of said electrically insulating coating members includes a projection formed on an inner wall surface thereof.

5. A noise filter comprising:

a magnetic core having a pair of magnetic core members each with a coupling surface, each of said pair of magnetic core members having a dented portion so arranged that, when said pair of magnetic core members are closed together on said coupling surfaces, a closed magnetic path and an opening for inserting therethrough a cable are formed therebetween;

an electrically insulating outer sheath member which is disposed on an outer surface of each of said pair of magnetic core members;

wherein an electrically insulating coating member is disposed on an inner wall surface of each of said dented portions, wherein when said pair of magnetic core members are closed together on said coupling surfaces, said pair of magnetic core members contact each other at said coupling surfaces, and wherein each of said electrically insulating coating members includes a projection formed on an inner wall surface thereof.

* * * * *